United States Patent [19]
Hoffman

[11] 3,936,826
[45] Feb. 3, 1976

[54] N DIMENSIONAL TARGET DESIGNATION VECTOR

[75] Inventor: James W. Hoffman, Palos Verdes Estates, Calif.

[73] Assignee: The United States of America as represented by the Secretary of the Army, Washington, D.C.

[22] Filed: July 19, 1974

[21] Appl. No.: 490,167

[52] U.S. Cl. .............................. 343/5 SA; 324/77 A
[51] Int. Cl.² ...................... G01R 17/02; G01S 9/02
[58] Field of Search ........ 343/5 SA; 324/77 A, 77 E

[56] References Cited
UNITED STATES PATENTS

| | | | |
|---|---|---|---|
| 3,215,934 | 11/1965 | Sallen | 343/5 SA |
| 3,636,562 | 1/1972 | Wehner | 343/5 SA |
| 3,718,929 | 2/1973 | Van Horn | 343/5 SA X |
| 3,719,945 | 3/1973 | Sletten et al. | 343/5 SA |
| 3,725,928 | 4/1973 | Klimchak et al. | 343/5 SA |

Primary Examiner—Malcolm F. Hubler
Attorney, Agent, or Firm—Lawrence A. Neureither; Joseph H. Beumer; Robert C. Sims

[57] ABSTRACT

Each of the parameters of objects in the field of view is measured and individually compared with standard parameters. Differences in these parameters are multiplied by individual weighting factors and they are summed for each object. Object having the lowest sum is the desired target.

5 Claims, 1 Drawing Figure

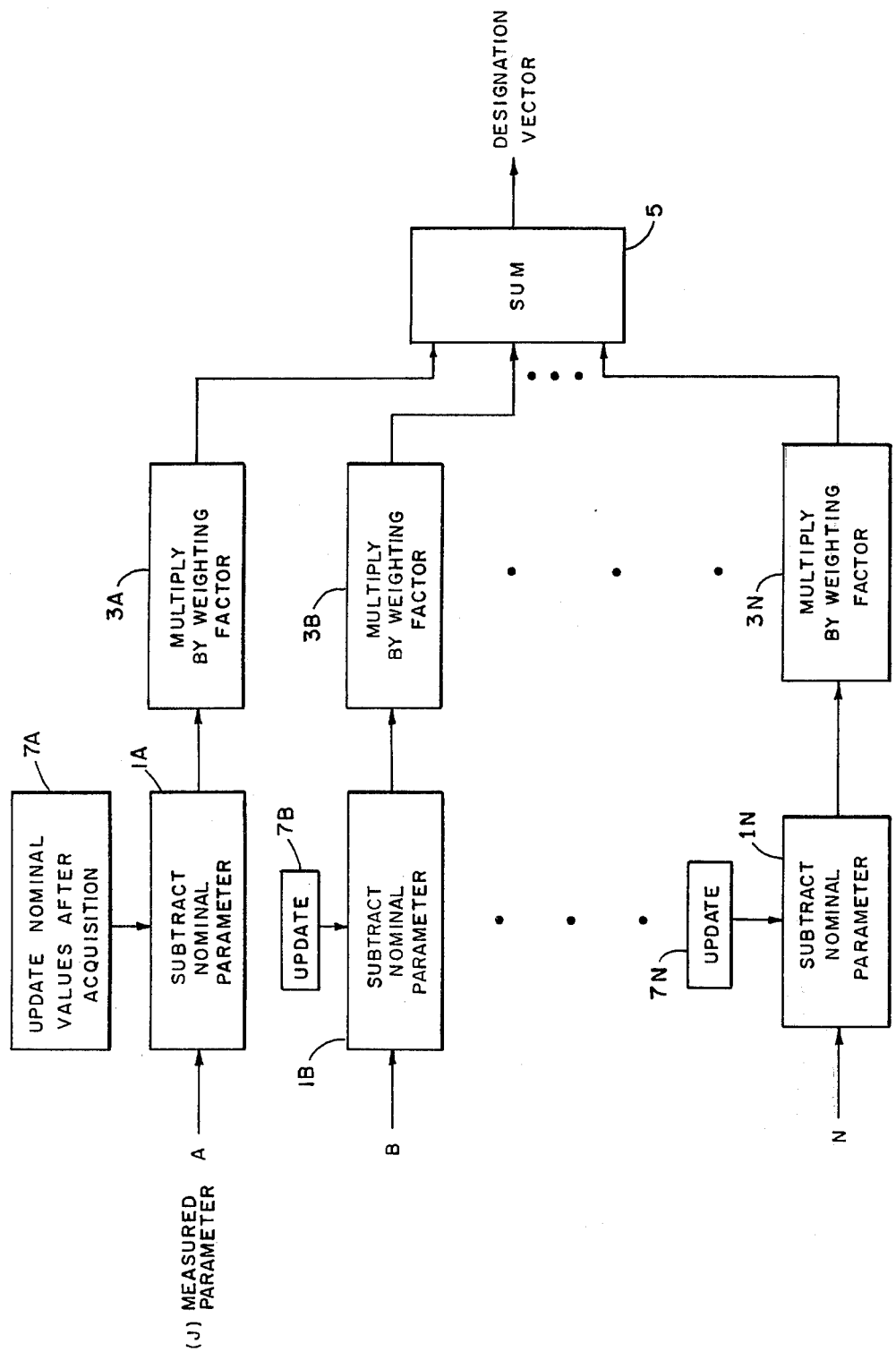

N DIMENSIONAL TARGET DESIGNATION VECTOR

SUMMARY OF THE INVENTION

Each individual parameter of a plurality of objects is compared with a normal parameter and multiplied by a weighting factor and summed to give a designated vector. Parameters can be updated after the acquisition of a particular object as the desired target. The updating of the parameters will be in accordance with the last reading on a selected target. This is done so as to avoid the drawing off of the track loop by another object passing through the field of view or by noise spikes occurring in the system.

BRIEF DESCRIPTION OF THE DRAWING

The single FIGURE is a block diagram illustrating a preferred embodiment of the invention.

DESCRIPTION OF THE PREFERRED EMBODIMENT

The purpose of the N Dimensional target designation vector of the FIGURE is to distinguish the object that most nearly represents the desired target from other objects in the field of view (FOV). To do this, various measurements A–N are made on each object in the FOV. For example, target intensity or amplitude is measured for each object. Also, by measuring the amplitude of each object in two different spectral regions and ratioing these two amplitudes, a measure of the object's temperature can be made. Each measured value is then compared in substractor 1A–1N against the nominal value that the true target is known to have.

Once this difference is taken for each type of measurement, a weighting factor is applied to it by multipliers 3A–3N so that the correct importance can be placed on each type of measurement. Thus, if the temperature ratio of a target is well known it would carry a high weighting factor. After all components are formed, they are summed by summer 5 to give the designation vector of that object.

The object that has the lowest vector total is the object that most closely resembles the desired target. For example, assume a target is known to have a nominal amplitude of $J_{nom}$, a nominal medium wavelength to long wavelength ratio of $(J_M/J_L)_{nom}$, and a nominal medium wavelength to intermediate wavelength ratio of $(J_M/J_I)$. Also assume the target should nominally be in the center of the FOV or at zero degrees in azimuth and elevation. Assuming weighting factors $W_J$, $W_{M/L}$, $W_{M/I}$, $W_{AZ}$, and $W_{EL}$ respectively, a five dimensional vector can be formed for each object in the FOV according to the following equation:

$$V = W_J \cdot [J - J_{nom}] + W_{M/L} \cdot [(J_M/J_L) - (J_M/J_L)_{nom}] + W_{M/I} \cdot [(J_M/J_I) - (J_M/J_I)_{nom}] + W_{AZ} \cdot \theta_{AZ} + W_{EL} \cdot \theta_{EL}$$

It can now be seen that the desired target will give a value of $V$ close to zero and can be selected from other objects in the FOV having higher vector totals.

It should be noted that if the system uses log amplifiers, the vector equation will be modified accordingly. Also, the weighting factors need not be constant, but if desired, can represent non linear functions in order to apply different amounts of weight depending on how far from nominal the measured parameter lies. In this case a look up multiplication table can be used for weighting. Also, different weights can be assigned in positive and negative directions from nominal.

This method of ranking all objects in a FOV and designating the correct target by its dimensional vector can be used in any search/-acquisition/track system where objects other than the target are expected to be in the FOV. Once the desired target is acquired and locked onto, if desired, the nominal (or expected) values for each parameter can then be updated by updaters 7A–7N to insure that the track loop will not be drawn off of the target by another object passing through the FOV, or by noise spikes occurring in the system.

The multipliers 3A–3N eliminate the sign of the vector coming from the subtractors 1A–1N so that summer 5 will receive the same sign vector component at its input. The designation vector output of summer 5 is obtained for each object and these are compared by comparable circuits not shown which select the target with the lowest designation vector. If desired the parameters of this selected object is fed to the subtractors 1A–1N so as to update them to read as the normal parameter that of the last reading on the selected object.

Any of the well known subtractors, multipliers, and summers may be used for the blocks shown in the FIGURE. The blocks labeled Update 7A–7N represent the values of the parameters of the selected object. These values are substituted for the normal parameters in blocks 1A–1N when desired by the system.

I claim:

1. In a detection system a method for evaluating received parameters from an object comprising the steps of:
   separating the different parameters of the object to be evaluated;
   subtracting from each parameter an amount equal to the normal parameter of a ideal return from a true target; and
   combining the difference of these parameters so as to obtain a summation of all the differences.

2. A method as set forth in claim 1 further comprising the step of:
   multiplying each difference in each parameter by different weighting factors before summing the differences.

3. A method as set forth in claim 2 further comprising the step of:
   multiplying the differences in a manner such that the products will all have the same sign for combining.

4. A method as set forth in claim 3 further comprising the steps of:
   performing the above steps on a plurality of objects within a certain range; and
   selecting an object having the lowest summation output as the desired target.

5. A method in a radar detection system as set forth in claim 4 further comprising the step of:
   updating the parameters in the subtraction for the next returns of the radar system in accordance with the measured parameters of the selected object.

* * * * *